United States Patent
Ueda

(10) Patent No.: US 8,199,597 B2
(45) Date of Patent: Jun. 12, 2012

(54) SEMICONDUCTOR MEMORY DEVICE INCLUDING A PLURALITY OF MEMORY CELL ARRAYS

(75) Inventor: Yoshihiro Ueda, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 231 days.

(21) Appl. No.: 12/769,523

(22) Filed: Apr. 28, 2010

(65) Prior Publication Data

US 2010/0277972 A1 Nov. 4, 2010

(30) Foreign Application Priority Data

Apr. 30, 2009 (JP) ................................. 2009-111283

(51) Int. Cl.
*G11C 7/02* (2006.01)
(52) U.S. Cl. ............. 365/210.1; 365/210.14; 365/230.03
(58) Field of Classification Search ............... 365/210.1, 365/210.14, 230.03
See application file for complete search history.

(56) References Cited

U.S. PATENT DOCUMENTS

| 6,587,371 | B1 | 7/2003 | Hidaka |
| 7,505,305 | B2 * | 3/2009 | Hidaka .................. 365/158 |
| 2010/0046274 | A1 | 2/2010 | Tsuchida et al. |

FOREIGN PATENT DOCUMENTS

JP  2008-147434  6/2008

OTHER PUBLICATIONS

Background Art Information.

* cited by examiner

*Primary Examiner* — Son Dinh
*Assistant Examiner* — Nam Nguyen
(74) *Attorney, Agent, or Firm* — Knobbe, Martens, Olson & Bear LLP

(57) ABSTRACT

First and second memory cell arrays are adjacent in a first direction. First and second areas are positioned adjacent to one and the other side of the first memory array in a second direction. Third and fourth areas are positioned adjacent to one and the other side of the second memory array in a second direction. A sense amplifier is arranged in the first area and a current sink is arranged in the fourth area. The sense amplifier compares a read current which flows into the current sink via a memory cell in the first memory cell array and the second area from the sense amplifier with a reference current which flows into the current sink via the third area and a reference memory cell in the second memory cell array from the sense amplifier.

19 Claims, 4 Drawing Sheets

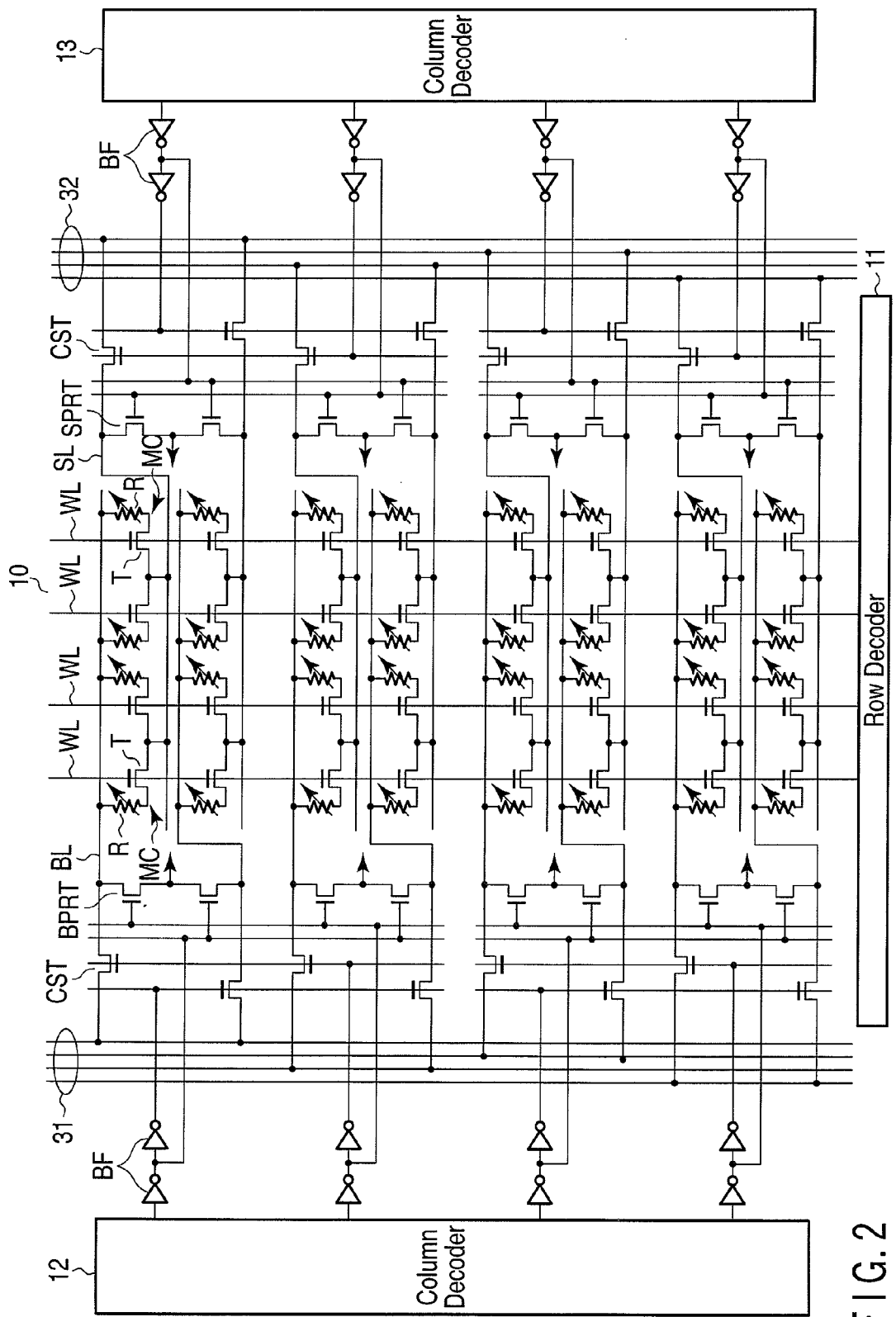
F I G. 2

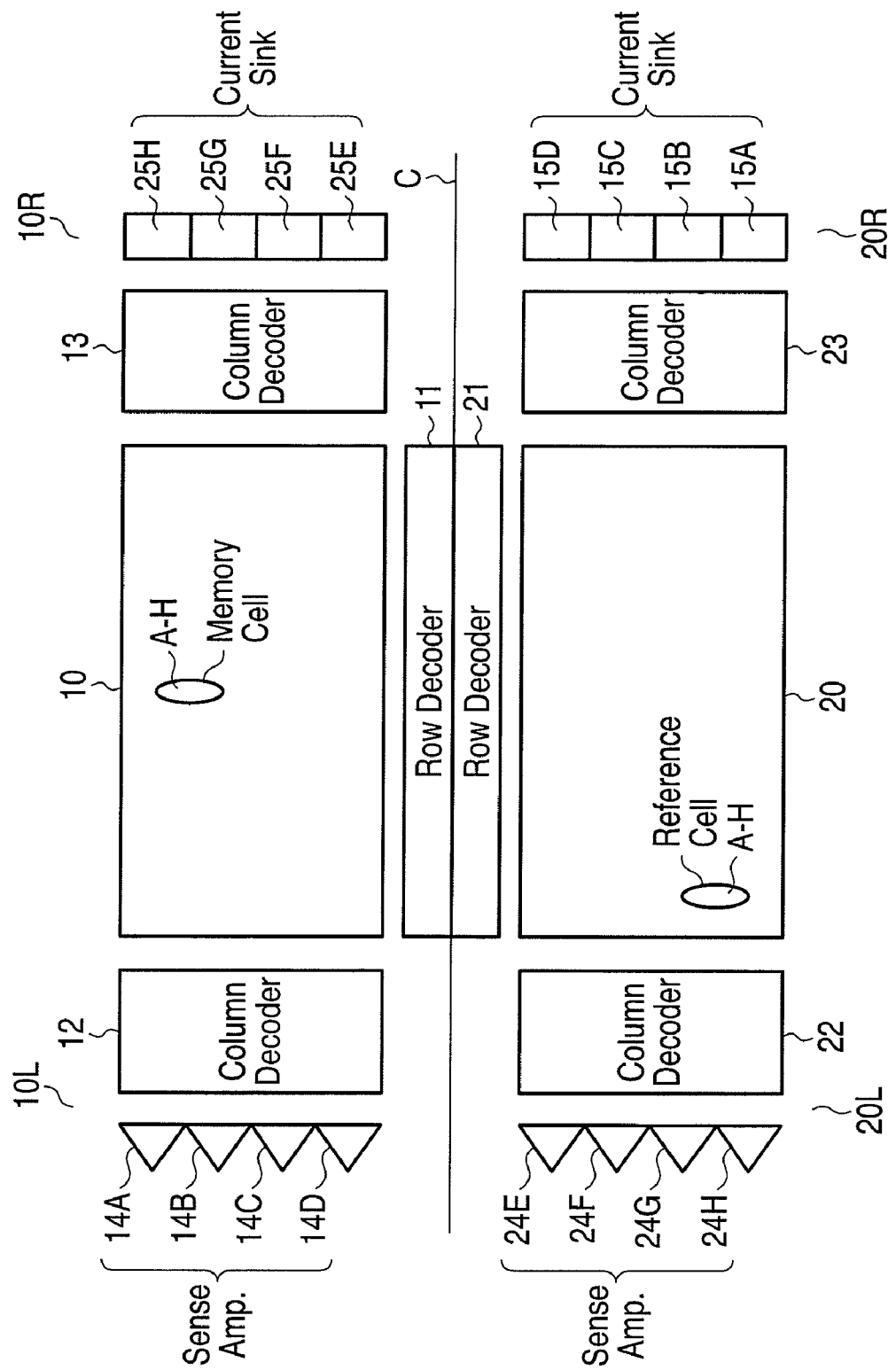
F I G. 4

SEMICONDUCTOR MEMORY DEVICE INCLUDING A PLURALITY OF MEMORY CELL ARRAYS

CROSS-REFERENCE TO RELATED APPLICATIONS

This application is based upon and claims the benefit of priority from prior Japanese Patent Application No. 2009-111283, filed Apr. 30, 2009, the entire contents of which are incorporated herein by reference.

BACKGROUND OF THE INVENTION

1. Field of the Invention

The present invention relates to a semiconductor memory device, and in particular, to a circuit layout of a semiconductor memory device using a magnetoresistive element as a memory cell.

2. Description of the Related Art

U.S. Pat. No. 6,587,371 discloses a magnetoresistive memory device such as a magnetoresistive memory device (MRAM), a phase-change memory device (PRAM) and ReRAM. The magnetoresistive memory device has a plurality of memory cell arrays, which are configured in such a manner that a plurality of memory cells using a magnetoresistive element is arrayed like a matrix. In the magnetoresistive memory device, different resistance states of a magnetoresistive element correspond to data "1" and "0". For example, a low resistance state of the magnetoresistive element is defined as data "0" while a high resistance state thereof is defined as data "1".

The magnetoresistive memory device has the following configuration. Specifically, in a data read operation from a memory cell array, a read current flows from a sense amplifier to a current sink via a select cell. In this case, a reference current flows from the sense amplifier to the current sink via a reference cell. The sense amplifier compares the read current with the reference current to determine a resistance state of the select cell.

A memory device using the foregoing magnetoresistive element needs to employ a method of carrying out data read from a memory cell array with higher precision.

Jpn. Pat. Appln. KOKAI Publication No. 2008-147437 discloses a drive layout of a magnetoresistive memory device, which is capable of reducing chip area and power consumption. Specifically, in a memory cell array, one common line is provided per two bit lines, and the common line is used in common to neighboring-column memory cells. Further, a bit line driver and a common line driver individually driving a bit line and a common line in a data write operation are arranged in a state of facing both sides of a memory cell array. Furthermore, memory cells are arrayed to be connected to different word line every column in each row of a memory cell array.

BRIEF SUMMARY OF THE INVENTION

According to a first aspect of the present invention, there is provided a semiconductor memory device comprising:

first and second memory cell arrays each including a plurality of memory cells and reference cells, and arrayed adjacent to each other in a first direction;

a first area positioned adjacent to the first memory array in a second direction orthogonal to the first direction;

a second area positioned adjacent to the first memory array on the side opposite to the first area in the second direction;

a third area positioned adjacent to the second memory cell array in the second direction, and positioned adjacent to the first area in the first direction;

a fourth area positioned adjacent to the second memory cell array on the side opposite to the third area in the second direction, and positioned adjacent to the second area in the first direction;

a first sense amplifier arranged in the first area, and supplying a read current to a first memory cell included in the first memory array while supplying a reference current to a first reference cell included in the second memory cell array by way of the third area; and a first current sink arranged in the fourth area, and sinking the read current of the first memory cell by way of the second area while sinking a reference current of the first reference cell, wherein the first sense amplifier senses a memory data of the first memory cell based on the read current and the reference current.

According to a second aspect of the present invention, there is provided a semiconductor memory device comprising:

first and second memory cell arrays each including a plurality of memory cells and reference cells, and arrayed adjacent to each other in a first direction;

a third memory cell array including a plurality of memory cells and reference cells, and arranged adjacent to the first memory cell array in a second direction orthogonal to the first direction;

a fourth memory cell array including a plurality of memory cells and reference cells, and arranged adjacent to the first memory cell array on the side opposite to the third memory cell array in the second direction;

a fifth memory cell array including a plurality of memory cells and reference cells, and arranged adjacent to the second memory cell array in the second direction, and further, arranged adjacent to the third memory cell array in the first direction;

a sixth memory cell array including a plurality of memory cells and reference cells, and arranged adjacent to the second memory cell array on the side opposite to the fifth memory cell array in the second direction;

a first area positioned between the first and third memory cell arrays;

a second area positioned between the first and fourth memory cell arrays;

a third area positioned between the second and fifth memory cell arrays;

a fourth area positioned between the second and sixth memory cell arrays;

a first sense amplifier arranged in the first area, and used in common to the first, second, third and fifth memory cell arrays;

a second sense amplifier arranged in the third area, and used in common to the first, second, third and fifth memory cell arrays;

a first current sink arranged in the fourth area, and used in common to the first, second, fourth and sixth memory cell arrays; and a second current sink arranged in the second area, and used in common to the first, second, fourth and sixth memory cell arrays, wherein the first sense amplifier supplies a first read current to a first memory cell included in the first memory cell array while supplies a first reference current to a first reference cell included in the second memory cell array by way of the third area, and the first current sink sinks the first read current by way of the second area while sinks the first reference current, and further, the second sense amplifier supplies a second read current to a second memory cell different from the first memory cell included in the first memory cell array by way of the first area while supplies a second reference current to a second reference cell different from the first reference cell included in the second memory cell, and the second current sink sinks the second read current while sinks the second reference current by way of the fourth area.

According to a third aspect of the present invention, there is provided a semiconductor memory device comprising:

first and second memory cell arrays each including a plurality of memory cells and reference cells, and arrayed adjacent to each other in a first direction;

a first area positioned adjacent to the first memory cell array in a second direction orthogonal to the first direction;

a second area positioned adjacent to the first memory cell array on the side opposite to the first area in the second direction;

a third area positioned adjacent to the second memory cell array in the second direction, and positioned adjacent to the first area in the first direction;

a fourth area positioned adjacent to the second memory cell array on the side opposite to the third area in the second direction, and positioned adjacent to the second area in the first direction;

a plurality of first sense amplifiers arranged in the first area, and supplying a first read current to any one of a plurality of first memory cells included in the first memory cell array while supplying a first reference current to any one of a plurality of first reference cells included in the second memory cell array by way of the third area;

a plurality of first current sinks arranged in the fourth area, and sinking the first read current by way of the second area while sinking the first reference current;

a plurality of second sense amplifiers arranged in the third area, and supplying a second read current to any one of a plurality of second memory cells included in the first memory cell array by way of the first area while supplying a second reference current to any one of a plurality of second reference cells included in the second memory cell; and a plurality of second current sinks arranged in the second area, and sinking the second read current while sinking the second reference current by way of the fourth area, wherein the plurality of first sense amplifiers each sense a memory data of the first memory cell based on the first read current and the first reference current, and the plurality of second sense amplifiers each sense a memory data of the second memory cell based on the second read current and the second reference current.

BRIEF DESCRIPTION OF THE SEVERAL VIEWS OF THE DRAWING

FIG. 2 is a circuit diagram showing each configuration of a memory cell array, a row decoder and a column decoder corresponding to the memory cell array, which are shown in FIG. 1;

FIG. 4 is a block diagram schematically showing the configuration of a core part of a semiconductor memory device according to a third embodiment of the present invention.

DETAILED DESCRIPTION OF THE INVENTION

Figure 1:
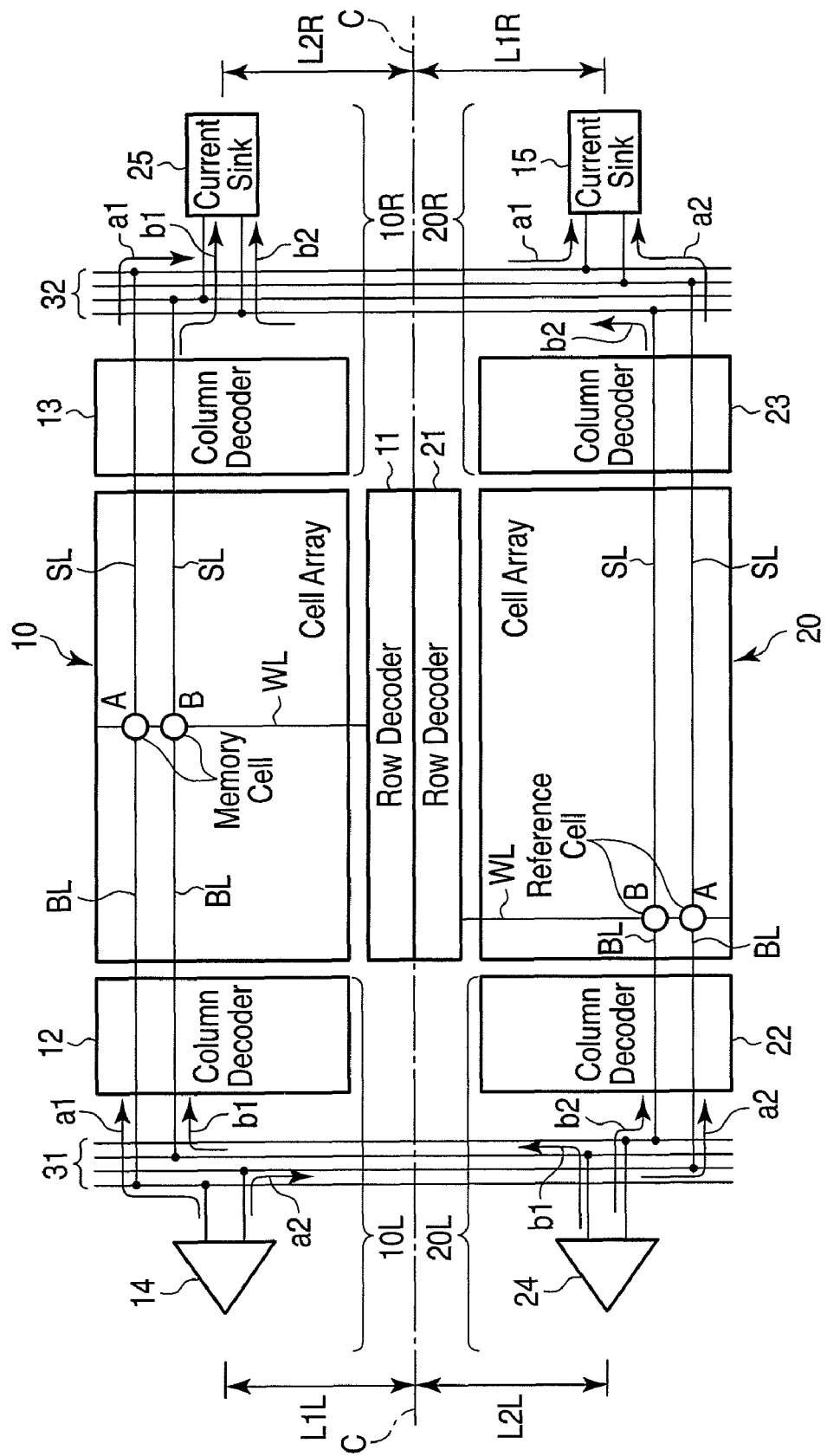
FIG. 1 is a block diagram schematically showing the configuration of a core part of a semiconductor memory device according to a first embodiment of the present invention.

Various embodiments of the present invention will be hereinafter described with reference to the accompanying drawings. The same reference numerals are used to designate common potions over the following all drawings.

First Embodiment

FIG. 1 schematically shows the configuration of a core part of a semiconductor memory device according to a first embodiment of the present invention. The semiconductor memory device includes a plurality of memory cell arrays having many memory cells using a magnetoresistive element. According to this embodiment, the following layout is given as one example. Namely, a first memory cell array 10 and a second memory cell array 20 are arrayed adjacent to each other in the row direction.

A first row decoder 11 and a second row decoder 21 corresponding to first and second memory cell arrays 10 and 20 are arrayed in one side area (i.e., area between memory cell arrays) in the row direction of the foregoing memory cell arrays 10 and 20. First and second row decoders 11 and 21 are connected to memory cells in the corresponding memory cell array and to reference cells thereof by way of word lines WL, respectively. According to this embodiment, a plurality of reference cells is arrayed at one side of the column direction in each memory cell array. Each side of the first memory cell array 10 in the column direction are provided with column decoders 12 and 13 corresponding to each side. Likewise, each side of the second memory cell array 20 in the column direction is provided with column decoders 22 and 23 corresponding to each side. These column decoders 12, 13, 22 and 23 select a bit line BL or a source line SL connected to the memory cell in the corresponding memory cell array or to the reference cell thereof.

A left-side area (first area) 10L of the first memory cell array 10 is provided with a first sense amplifier 14. Likewise, a left-side area (third area) 20L of the second memory cell array 20 is provided with a second sense amplifier 24. A right-side area (fourth area) 20R of the second memory cell array 20 is provided with a first current sink 15. Likewise, a right-side area (second area) 10R of the first memory cell array 10 is provided with a second current sink 25. In other words, the first sense amplifier 14 and the second current sink 25 are individually arranged at the corresponding each side of the first memory cell array 10. Likewise, the second sense amplifier 24 and the first current sink 15 are individually arranged at the corresponding each side of the second memory cell array 20.

One side of first and second memory cell arrays 10 and 20 in the column direction, that is, first and third areas 10L and 20L are provided with a first data bus 31 crossing the foregoing both areas. Likewise, the other side of memory cell arrays 10 and 20 in the column direction, that is, second and fourth areas 20R and 10R are provided with a second data bus 32 crossing the foregoing both areas. These data buses 31 and 32 are connected to bit lines BL or source lines SL of the first and second memory cell arrays by way of each column select transistor described later.

First and second sense amplifiers 14 and 24 are connected to the first data bus 31. Likewise, first and second current sinks 15 and 25 are connected to the second data bus 32. When data is read from a memory cell of the first and second memory cell arrays 10 and 20, first and second sense amplifiers 14 and 24 supply a read current and a reference current to selected memory and reference cells. On the other hand, first and second current sinks 15 and 25 sink a read current and a reference current.

According to the foregoing configuration, for example, two memory cells A and B are concurrently selected as a read target in the first memory cell array 10. On the other hand, two reference cells A and B are concurrently selected in the second memory cell array 20. When two memory cells are selected in the second memory cell array 20, two reference cells are concurrently selected in the first memory cell array 10.

When two memory cells A and B are selected in the first memory cell array 10, the first sense amplifier 14 is connected to the first current sink 15 by way of the first data bus 31, the memory cell A of the first memory cell array 10 and the second data bus 32. Simultaneously, the first sense amplifier 14 is connected to the first current sink 15 by way of the first data bus 31, the reference cell A of the second memory cell array 20 and the second data bus 32. On the other hand, the second sense amplifier 24 is connected to the second current sink 25 by way of the first data bus 31, the memory cell B of the first memory cell array 10 and the second data bus 32. Simultaneously, the second sense amplifier 24 is connected to the second current sink 25 by way of the first data bus 31, the reference cell B of the second memory cell array 20 and the second data bus 32.

The layout relationship between first sense amplifier 14 and first current sink 15 is set so that these amplifier 14 and sink 15 cross each other with respect to the center line C extending in the column direction between first and second memory cell arrays 10 and 20. Likewise, the layout relationship between second sense amplifier 24 and second current sink 25 is set so that these amplifier 24 and sink 25 cross each other with respect to the center line C extending in the column direction between first and second memory cell arrays 10 and 20. Namely, the positional line connecting of the first sense amplifier 14 with of the first current sink 15 and the positional line connecting of the second sense amplifier 24 with the second current sink 25 cross like X with respect to the center line C between first and second memory cell arrays 10 and 20.

FIG. 2 shows the configuration of the first memory cell array 10, and the row decoder 11 and two column decoders 12 and 13, which correspond to the array 10. The first memory cell array 10 is provided with a plurality number of 1-transistor 1-magnetoresistive element (1T1R) memory cells MC. Each of the memory cells is configured so that a magnetoresistive element R and a select transistor T are connected in series. A plurality of bit lines BL and source lines SL are formed in the column direction while a plurality of word lines are formed in the row direction. One terminal of select transistors T of the same column memory cells are connected in common to the source line SL. One terminal of magnetoresistive elements R are connected in common to the bit line BL. Moreover, gate electrodes of select transistors T of the same row memory cell are connected in common to the word line WL.

One side of the memory cell array 10 in the row direction is provided with a row decoder 11 while both sides thereof in the column direction is provided with data bus 31, 32, column decoders 12 and 13.

One data bus 31 is connected to each bit line BL via each column select transistor CST. Each bit line BL is connected with a bit line precharge transistor BPRT. On/off of the foregoing column select transistor CST and bit line precharge transistor BPRT is selectively controlled by means of a plurality of buffer circuits BF supplied with an output signal of the column decoder 12 for selecting a bit line.

The other data bus 32 is connected to each source line SL via each column select transistor CST. Each source line SL is connected with a source line precharge transistor SPRT. On/off of the foregoing column select transistor CST and source line precharge transistor SPRT is selectively controlled by means of a plurality of buffer circuits BF supplied with an output signal of the column decoder 13 for selecting a source line.

According to the foregoing configuration, a word line WL is selected by means of the row decoder 11 according to an address signal input to row decoder 11. Further, a source line SL and a bit line BL are selected by means of column decoders 12 and 13 according to an address signal input to two column decoders 12 and 13. In this way, any two memory cells MC are simultaneously selected. Both terminals of each memory cell MC thus selected are connected to sense amplifier and current sink shown in FIG. 1 by way of data buses 31 and 32 provided at both sides of the memory cell array 10.

In a data read operation from first and second memory cell arrays 10 and 20, when the memory cell A of the first memory cell array 10 is selected, address is designated so that the reference cell A of the second memory cell array 20 is selected. Moreover, when the memory cell B of the first memory cell array 10 is selected, address is designated so that the reference cell B of the second memory cell array 20 is selected. According to this embodiment, the following read operation from first and second memory cell arrays 10 and 20 will be described as one example. Namely, memory cells A and B of the first memory cell array 10 and reference cells A and B of the second memory cell array 20 are concurrently selected to carry out a data read operation.

For example, a read current of the memory cell A of the first memory cell array 10 flows along the arrow line path a1 shown in FIG. 1. Specifically, the read current flows from the first sense amplifier 14 to the first current sink 15 by way of the first data bus 31, the memory cell A and the second data bus 32. Moreover, a reference current of the reference cell A flows along the arrow line path a2 shown in FIG. 1. Specifically, the reference current flows from the first sense amplifier 14 to the first current sink 15 by way of the first data bus 31, the reference cell A of the second memory cell array 20 and the second data bus 32. The foregoing read current and reference current are compared by means of the first sense amplifier 14 to determine a resistance state in the memory cell A; in this way, memory data is read.

On the other hand, a read current of the memory cell B of the first memory cell array 10 flows along the arrow line path b1 shown in FIG. 1. Specifically, the read current flows from the second sense amplifier 24 to the second current sink 25 by way of the first data bus 31, the memory cell B and the second data bus 32. Moreover, a reference current of the reference cell B flows along the arrow line path b2 shown in FIG. 1. Specifically, the reference current flows from the second sense amplifier 24 to the second current sink 25 by way of the first data bus 31, the reference cell B of the second memory cell array 20 and the second data bus 32. The foregoing read current and reference current are compared by means of the second sense amplifier 24 to determine a resistance state in the memory cell B; in this way, memory data is read.

As described above, according to the first embodiment, the total of the interconnect length of the path a1 of the read current flowing to the memory cell A and the total of that of the path a2 of the read current flowing to the reference cell A become substantially the same. Likewise, the total of the interconnect length of the path b1 of the read current flowing to the memory cell B and the total of that of the path b2 of the read current flowing to the reference cell B become substantially the same. This means that an influence of interconnect parasitic resistance becomes substantially the same in the foregoing read current and reference current. Therefore, the first or second sense amplifier 14 or 24 is capable of reading memory data of the memory cell A or B with higher precision.

Preferably, the first sense amplifier 14 and the first current sink 15 are arranged to satisfy the following condition. According to the condition, the first sense amplifier 14 and the first current sink 15 are arranged so that the total of the interconnect length of the path a1 of the read current flowing to the memory cell A and the total of that of the path a2 of the read current flowing to the reference cell A become substantially the same. In other words, the first sense amplifier 14 and the first current sink 15 are arranged so that the following distances become substantially the same. One is a distance L1L from the center line C extending to the column direction between first and second memory cell arrays 10 and 20 to the first sense amplifier 14. The other is a distance L1R from the center line C to the first current sink 15. Likewise, the second sense amplifier 24 and the second current sink 25 are arranged to satisfy the following condition. According to the condition, the second sense amplifier 24 and the second current sink 25 are arranged so that the total of the interconnect length of the path b1 of the read current flowing to the memory cell B and the total of that of the path b2 of the read current flowing to the reference cell B become substantially the same. In other words, the second sense amplifier 24 and the second current sink 25 are arranged so that the following distances become substantially the same. One is a distance L2L from the center line C extending to the column direction between first and second memory cell arrays 10 and 20 to the second sense amplifier 24. The other is a distance L2R from the center line C to the second current sink 25.

Preferably, a reference cell position is selected in accordance with the position of the selected memory cell to satisfy the following condition. According to the condition, the reference cell position is selected so that a distance from the center line C to the first memory cell A (or memory cell B) and a distance from the center line C to the first reference cell A (or reference cell B) become substantially the same. In this case, a reference cell of specified address position may be fixedly selected.

Second Embodiment

Figure 3:
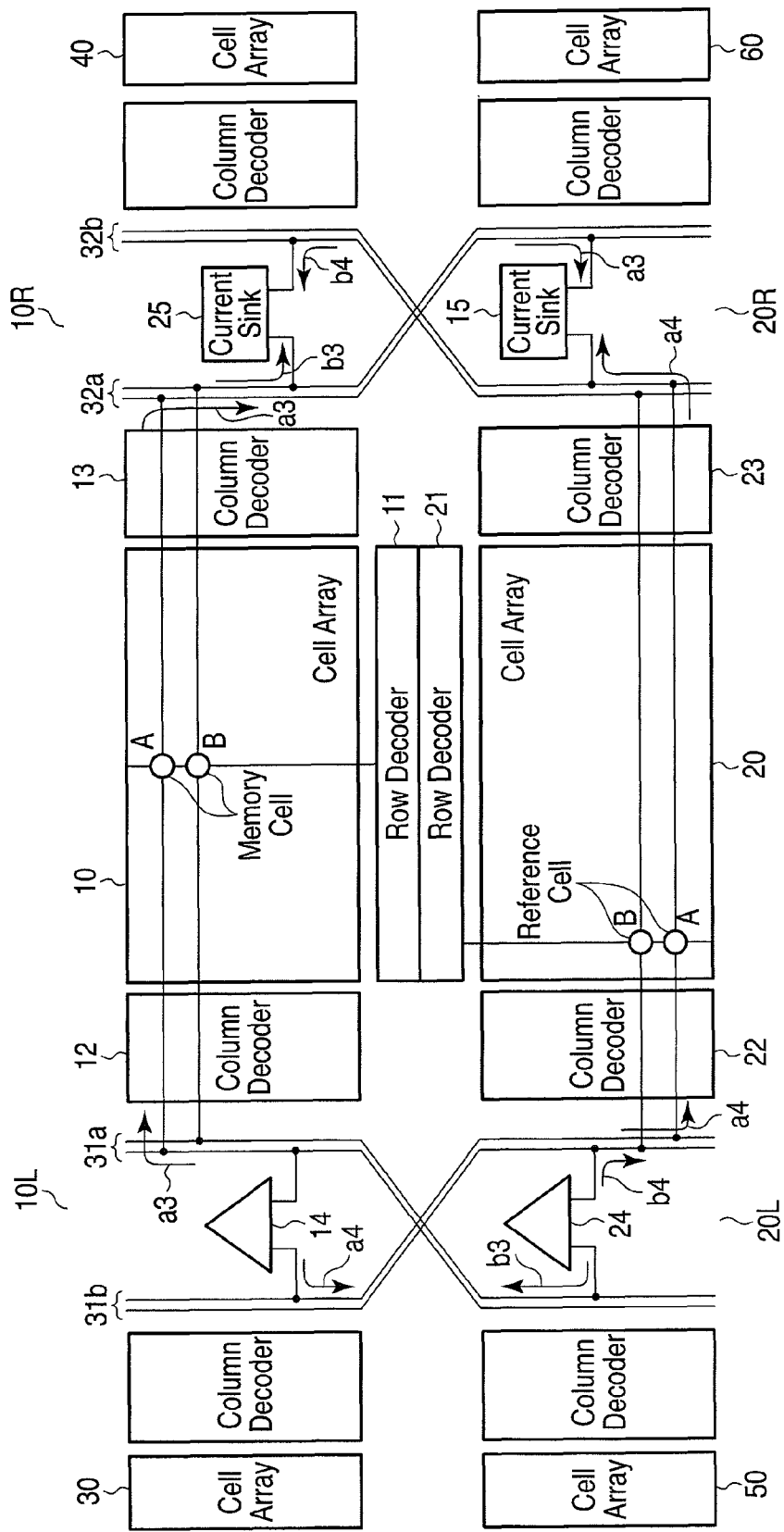
FIG. 3 is a block diagram schematically showing the configuration of a core part of a semiconductor memory device according to a second embodiment of the present invention.

FIG. 3 schematically shows the configuration of a core part of a semiconductor memory device according to a second embodiment of the present invention. The second embodiment is applied to a semiconductor memory device having the following configuration. According to the configuration, the device includes a plurality of memory cell arrays having many memory cells arrayed. Further, two memory cell arrays adjacent to each other in the column direction, that is, four memory cell arrays in total use two sense amplifiers in common to these arrays. Furthermore, two memory cell arrays adjacent to each other in the column direction, that is, four memory cell arrays in total use two current sinks in common to these arrays. Therefore, the second embodiment differs from the first embodiment in the data bus configuration.

Specifically, first and second memory cell arrays 10 and 20 are arranged adjacent to each other in the row direction. A third memory cell array 30 is arranged adjacent to the first memory cell array 10 in the column direction. A fourth memory cell array 40 is arranged adjacent to the first memory cell array 10 on the side opposite to the third memory cell array 30 in the column direction. A fifth memory cell array 50 is arranged adjacent to the second memory cell array 20 in the column direction. A sixth memory cell array 60 is arranged adjacent to the second memory cell array 20 on the side opposite to the fifth memory cell array 50 in the column direction. Third and fifth memory cell arrays 30 and 50 are arranged adjacent to each other in the row direction. Likewise, fourth and sixth memory cell arrays 40 and 60 are arranged adjacent to each other in the row direction. These first to sixth memory cell arrays each includes a plurality of memory cells and reference cells like the first embodiment.

A first area 10L positioning between first and third memory cell arrays 10 and 30 is provided with a first sense amplifier 14. A third area 20L positioning between second and fifth memory cell arrays 20 and 50 is provided with a second sense amplifier 24. A second area 10R positioning between first and fourth memory cell arrays 10 and 40 is provided with a second current sink 25. A fourth area 20R positioning between second and sixth memory cell arrays 20 and 60 is provided with a first current sink 15. The foregoing first and second sense amplifiers 14 and 24 are used in common to first, second, third and fifth memory cell arrays, and supply the foregoing read current and reference current when data is read from these memory cell arrays. The foregoing first and second current sinks 15 and 25 are used in common to first, second, fourth and sixth memory cell arrays, and sink the foregoing read current and reference current when data is read from these memory cell arrays.

In a left-side area of first and second memory cell arrays 10 and 20, that is, the first area 10L and the third area 20L, a first bus 31 is divided to two pairs of bus lines 31a and 31b each having the same number of lines. The foregoing two pairs of bus lines 31a and 31b cross each other between the first area 10L and the third area 20L. A pair of sense input nodes of the first sense amplifier 14 is connected individually to two pairs of bus lines 31a and 31b of the first data bus 31. Likewise, a pair of sense input nodes of the second sense amplifier 24 is connected individually to two pairs of bus lines 31a and 31b of the first data bus 31.

In a right-side area of first and second memory cell arrays 10 and 20, that is, the second area 10R and the fourth area 20R, a second bus 32 is divided to two pairs of bus lines 32a and 32b each having the same number of lines. The foregoing two pairs of bus lines 32a and 32b cross each other between the second area 10R and the fourth area 20R. A pair of current input nodes of the first current sink 15 is connected individually to two pairs of bus lines 32a and 32b of the second data bus 32. Likewise, a pair of current input nodes of the second current sink 25 is connected individually to two pairs of bus lines 32a and 32b of the second data bus 32.

According to this embodiment, the following read operation from a memory cell array will be described as one example. Namely, memory cells A and B of the first memory cell array 10 and reference cells A and B of the second memory cell array 20 are concurrently selected to carry out a data read operation.

For example, a read current of the memory cell A flows along the arrow line path a3 shown in FIG. 3. Specifically, the read current flows from the first sense amplifier 14 to the first current sink 15 by way of the bus line 31a of the first data 31, the memory cell A and the bus line 32a of the second data bus 32. Moreover, a reference current of the reference cell A flows along the arrow line path a4 shown in FIG. 3. Specifically, the reference current flows from the first sense amplifier 14 to the first current sink 15 by way of the bus line 31b of the first data bus 31, the reference cell A and the bus line 32b of the second data bus 32. The foregoing read current and reference current are compared by the first sense amplifier 14 to determine a resistance state of the memory cell A; in this way, memory data is read.

On the other hand, a read current of the memory cell B flows along the arrow line path b3 shown in FIG. 3. Specifically, the read current flows from the second sense amplifier 24 to the second current sink 25 by way of the bus line 31a of the first data bus 31, the memory cell B and the bus line 32a of the second data bus 32. Moreover, a reference current of the reference cell B flows along the arrow line path b4 shown in FIG. 3. Specifically, the reference current flows from the second sense amplifier 24 to the second current sink 25 by way of the bus line 31b of the first data bus 31, the reference cell B and the bus line 32b of the second data bus 32. The foregoing read current and reference current are compared by the second sense amplifier 24 to determine a resistance state of the memory cell B; in this way, memory data is read.

As described above, according to the second embodiment, the total of the interconnect length of the path of the read current flowing to the memory cell and the total of that of the path of the read current flowing to the reference cell become substantially the same. Therefore, this serves to read data stored in the memory with higher precision. In addition, the memory device has the configuration that the number of using sense amplifiers, current sinks and data buses can be reduced. As a result, the memory chip area efficiency is improved.

Third Embodiment

FIG. 4 schematically shows the configuration of a core part of a semiconductor memory device according to a third embodiment of the present invention. This third embodiment differs from the first embodiment in the configuration. Specifically, one side of a first memory cell array 10 in the column direction, that is, a first area 10L is provided with four sense amplifiers 14A to 14D. One side of a second memory cell array 20 in the column direction, that is, a third area 20L is provided with four sense amplifiers 24E to 24H. The other side of the second memory cell array 20 in the column direction, that is, a third area 20R is provided with four current sinks 15A to 15D. The other side of the first memory cell array 10 in the column direction, that is, a second area 10R is provided with four current sinks 25E to 25H.

In this case, the foregoing sense amplifiers 14A to 14H and current sinks 15A to 15H are arranged to satisfy the condition. According to the condition, the corresponding one pair of these amplifiers and sinks are arranged so that a distance from the center line C between first and second memory cell arrays 10 and 20 to the sense amplifier and a distance from the center line C to the current sink becomes substantially the same. Moreover, preferably, a reference cell is selected so that a distance from the center line C between first and second memory cell arrays 10 and 20 to memory cells A to H and a distance from the center line C to the corresponding reference cells A to H becomes substantially the same.

The foregoing configuration is employed, and thereby, the same advantage as the first embodiment is obtained. Namely, in sense amplifiers 14A to 14D, 24E to 24H, current sinks 15A to 15D and 25E to 25H, the corresponding one pair is arranged so that the total of the interconnect length of the path of the read current flowing to the memory cell and the total of that of the path of the read current flowing to the reference cell become substantially the same.

According to this embodiment, the following read operation from a memory cell array will be described as one example. Namely, memory cells A to H of the first memory cell array 10 and reference cells A to H of the second memory cell array 20 are concurrently selected to carry out a data read operation.

For example, a read current of the memory cell A flows from the first sense amplifier 14A to the first current sink 15A by way of the first data bus 31 (shown in FIG. 1), the memory cell A and the second data bus 32 (shown in FIG. 1). Moreover, a reference current of the reference cell A flows from the first sense amplifier 14A to the first current sink 15A by way of the first data bus 31 (shown in FIG. 1), the reference cell A and the second data bus 32 (shown in FIG. 1). The foregoing read current and reference current are compared by the first sense amplifier 14A to determine a resistance state of the memory cell A; in this way, memory data is read. In the same manner as the foregoing memory cell A, each read of memory cells B to D is carried out using the corresponding sense amplifiers 14B to 14D and current sinks 15B to 15D.

A read current of the memory cell E flows from the second sense amplifier 24E to the second current sink 25E by way of the first data bus 31 (shown in FIG. 1), the memory cell E and the second data bus 32 (shown in FIG. 1). Moreover, a reference current of the reference cell E flows from the second sense amplifier 24E to the second current sink 25E by way of the first data bus 31 (shown in FIG. 1), the reference cell E and the second data bus 32 (shown in FIG. 1). The foregoing read current and reference current are compared by the second sense amplifier 24E to determine a resistance state of the memory cell A; in this way, memory data is read. In the same manner as the foregoing memory cell E, each read of memory cells F to H is carried out using the corresponding sense amplifiers 24F to 24H and current sinks 25F to 21H.

According to the foregoing third embodiment, the total of the interconnect length of the path of the read current flowing to the memory cell and the total of that of the path of the read current flowing to the reference cell become substantially the same, like the first embodiment. Therefore, data stored in the memory cell can be read with higher precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
first and second memory cell arrays next to each other in a first direction, comprising a plurality of memory cells and reference cells;
a first area next to the first memory array in a second direction orthogonal to the first direction;
a second area next to the first memory array on the side opposite to the first area in the second direction;
a third area next to the second memory cell array in the second direction, and next to the first area in the first direction;
a fourth area next to the second memory cell array on a side opposite to the third area in the second direction, and next to the second area in the first direction;
a first sense amplifier in the first area, configured to supply a read current to a first memory cell in the first memory array while supplying a reference current to a first reference cell in the second memory cell array via the third area; and a first current sink in the fourth area, configured to sink the read current of the first memory cell via the second area while sinking a reference current of the first reference cell, wherein the first sense amplifier is configured to sense a memory data of the first memory cell based on the read current and the reference current.

2. The device of claim 1, wherein a distance from a center line along the second direction between the first and second memory cell arrays to the first sense amplifier and a distance from the center line to the first current sink are substantially the same.

3. The device of claim 1, wherein a distance from a center line along the second direction between the first and second memory cell arrays to the first memory cell of the first memory cell array and a distance from the center line to the first reference cell of the second memory cell array are substantially the same.

4. The device of claim 1, wherein the memory cell and the reference cell comprise a magnetoresistive element and a select transistor connected to the magnetoresistive element.

5. The device of claim 4, wherein the magnetoresistive element comprises a first terminal and a second terminal, and the select transistor comprises a current path and a control gate electrode, wherein the first terminal of the magnetoresistive element is connected to a first terminal of the current path of the select transistor while the second terminal of the magnetoresistive element is connected to a source line, and wherein the control gate electrode is connected to a word line.

6. The device of claim 1, further comprising:

a first data bus crossing the first and third areas, and configured to transmit the read current and the reference current to the first and second memory cell array; and a second data bus crossing the second and fourth areas, and configured to transmit the read current and the reference current to the first current sink.

7. The device of claim 1, further comprising:

a second sense amplifier in the third area, configured to supply a read current to a second memory cell different from the first memory cell in the first memory array via the third area while supplying a reference current to a second reference cell different from the first reference cell in the second memory cell array; and a second current sink in the second area, configured to sink a read current of the second memory cell while sinking a reference current of the second reference cell via the fourth area, wherein the second sense amplifier is configured to sense a memory data of the second memory cell based on the read current and the reference current.

8. The device of claim 7, wherein a distance from a center line along the second direction between the first and second memory cell arrays to the second sense amplifier and a distance from the center line to the second current sink are substantially the same.

9. A semiconductor memory device comprising:

first and second memory cell arrays next to each other in a first direction, comprising a plurality of memory cells and reference cells;

a third memory cell array next to the first memory cell array in a second direction orthogonal to the first direction, comprising a plurality of memory cells and reference cells;

a fourth memory cell array next to the first memory cell array on a side opposite to the third memory cell array in the second direction, comprising a plurality of memory cells and reference cells;

a fifth memory cell array next to the second memory cell array in the second direction and next to the third memory cell array in the first direction, comprising a plurality of memory cells and reference cells;

a sixth memory cell array next to the second memory cell array on a side opposite to the fifth memory cell array in the second direction, comprising a plurality of memory cells and reference cells;

a first area between the first and third memory cell arrays;

a second area between the first and fourth memory cell arrays;

a third area between the second and fifth memory cell arrays;

a fourth area between the second and sixth memory cell arrays;

a first sense amplifier in the first area, and configured to be used in common to the first, second, third and fifth memory cell arrays;

a second sense amplifier in the third area, and configured to be used in common to the first, second, third and fifth memory cell arrays;

a first current sink in the fourth area, and configured to be used in common to the first, second, fourth and sixth memory cell arrays; and a second current sink in the second area, and configured to be used in common to the first, second, fourth and sixth memory cell arrays, wherein the first sense amplifier is configured to supply a first read current to a first memory cell in the first memory cell array while supplying a first reference current to a first reference cell in the second memory cell array via the third area, and the first current sink is configured to sink the first read current via the second area while sinking the first reference current, and wherein the second sense amplifier is configured to supplies a second read current to a second memory cell different from the first memory cell in the first memory cell array via the first area while supplying a second reference current to a second reference cell different from the first reference cell in the second memory cell, and the second current sink is configured to sink the second read current while sinking the second reference current via the fourth area.

10. The device of claim 9, wherein a distance from a center line along the second direction between the first, third and fourth memory cell arrays and the second, fifth and sixth memory cell arrays to the first sense amplifier and a distance from the center line to the first current sink are substantially the same, and a distance from the center line to the second sense amplifier and a distance from the second current sink are substantially the same.

11. The device of claim 9, wherein a distance from a center line along the second direction between the first, third and fourth memory cell arrays and the second, fifth and sixth memory cell arrays to the first memory cell in the first memory cell array and a distance from the center line to the first reference cell in the second memory cell array are substantially the same, and a distance from the center line to the second memory cell in the first memory cell array and a distance from the second reference cell in the second memory cell array are substantially the same.

12. The device of claim 9, wherein the memory cell and the reference cell comprise a magnetoresistive element and a select transistor connected to the magnetoresistive element.

13. The device of claim 12, wherein the magnetoresistive element comprises a first terminal and a second terminal, and the select transistor comprises a current path and a control gate electrode,
- wherein the first terminal of the magnetoresistive element is connected to a first terminal of the current path of the select transistor while the second terminal of the magnetoresistive element is connected to a source line, and
- wherein the control gate electrode is connected to a word line.

14. The device of claim 9, further comprising:
- a first data bus crossing the first and third areas, and comprising a plurality of bus lines divided to two bus lines, the plurality of bus lines are configured to transmit the first and second read currents and reference currents to the first and second memory cell arrays, the two bus lines crossing between the first and third areas; and
- a second data bus crossing the second and fourth areas, and comprising a plurality of bus lines divided to two bus lines, the plurality of bus lines are configured to transmit the first and second read currents and reference currents to the first and second current sinks, the two bus lines crossing between the second and fourth areas.

15. A semiconductor memory device comprising:
- first and second memory cell arrays next to each other in a first direction, comprising a plurality of memory cells and reference cells;
- a first area next to the first memory cell array in a second direction orthogonal to the first direction;
- a second area next to the first memory cell array on a side opposite to the first area in the second direction;
- a third area next to the second memory cell array in the second direction, and next to the first area in the first direction;
- a fourth area next to the second memory cell array on a side opposite to the third area in the second direction, and next to the second area in the first direction;
- a plurality of first sense amplifiers in the first area, configured to supply a first read current to one of a plurality of first memory cells in the first memory cell array while supplying a first reference current to one of a plurality of first reference cells in the second memory cell array via the third area;
- a plurality of first current sinks in the fourth area, configured to sink the first read current via the second area while sinking the first reference current;
- a plurality of second sense amplifiers in the third area, configured to supply a second read current to one of a plurality of second memory cells in the first memory cell array via the first area while supplying a second reference current to one of a plurality of second reference cells in the second memory cell; and
- a plurality of second current sinks in the second area, configured to sink the second read current while sinking the second reference current via the fourth area,
- wherein the plurality of first sense amplifiers are configured to sense a memory data of the first memory cell based on the first read current and the first reference current, and the plurality of second sense amplifiers are configured to sense a memory data of the second memory cell based on the second read current and the second reference current.

16. The device of claim 15, wherein the number of the plurality of first sense amplifiers and the number of the plurality of first current sinks are the same, and the number of the plurality of second sense amplifiers and the number of the plurality of second current sinks are the same.

17. The device of claim 15, wherein the memory cell and the reference cell comprise a magnetoresistive element and a select transistor connected to the magnetoresistive element.

18. The device of claim 17, wherein the magnetoresistive element comprises a first terminal and a second terminal, and the select transistor comprises a current path and a control gate electrode,
- wherein the first terminal of the magnetoresistive element is connected to a first terminal of the current path of the select transistor while the second terminal of the magnetoresistive element is connected to a source line, and
- wherein the control gate electrode is connected to a word line.

19. The device of claim 15, further comprising:
- a first data bus crossing the first and third areas, and configured to transmit the first and second read currents and reference currents to the first and second memory cell arrays; and
- a second data bus crossing the second and fourth areas, and configured to transmit the first and second read currents and reference currents to the first and second current sinks.

* * * * *